(12) United States Patent
Ohuchi

(10) Patent No.: US 7,745,868 B2
(45) Date of Patent: Jun. 29, 2010

(54) SEMICONDUCTOR DEVICE AND METHOD OF FORMING THE SAME

(75) Inventor: Masahiko Ohuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 247 days.

(21) Appl. No.: 11/984,470

(22) Filed: Nov. 19, 2007

(65) Prior Publication Data

US 2008/0121960 A1    May 29, 2008

(30) Foreign Application Priority Data

Nov. 24, 2006    (JP)    .............................. 2006-317302

(51) Int. Cl.
*H01L 29/94*    (2006.01)
*H01L 27/108*   (2006.01)

(52) U.S. Cl. .................. 257/307; 257/296; 257/308; 257/309; 257/E27.089; 257/E27.103; 257/E27.104

(58) Field of Classification Search .................. 257/307, 257/308, 309, E27.089, E27.103, E27.104, 257/296
See application file for complete search history.

(56) References Cited

U.S. PATENT DOCUMENTS 7,244,982 B2 *    7/2007    Natsume et al. ............. 257/301

7,449,739 B2 *    11/2008    Heitmann et al. ........... 257/296

FOREIGN PATENT DOCUMENTS

| JP | 11-017143   | 1/1999  |
|----|-------------|---------|
| JP | 11-068041   | 3/1999  |
| JP | 2000-315778 | 11/2000 |
| JP | 2002-83881  | 3/2002  |
| JP | 2002-252337 | 9/2002  |
| JP | 2005-064466 | 3/2005  |

* cited by examiner

*Primary Examiner*—Long K Tran
(74) *Attorney, Agent, or Firm*—Young & Thompson

(57) ABSTRACT

A semiconductor device may include a MOS transistor having source and drain regions in a semiconductor substrate, a first inter-layer insulator having first contact holes that reach the source and drain regions over the MOS transistor. Cell contact plugs in the first contact holes contact with the source and drain regions. A second inter-layer insulator over the first inter-layer insulator and the cell contact plugs has second contact holes that reach the cell contact plugs. Contact plugs each have first and second portions. The first portion is in the second contact hole. The second portion extends over the first second inter-layer insulator. Metal barrier layers cover the upper surfaces of the second portions of the contact plugs. Capacitors each have a bottom electrode layer, a capacitive insulating layer and a top electrode layer. The bottom electrode layers each have a contact portion that contacts with the metal barrier layer.

9 Claims, 6 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same. More specifically, the present invention relates to a semiconductor memory device such as DRAM (Dynamic Random Access Memory) including memory cells having contact structures and a method of forming the same.

Priority is claimed on Japanese Patent Application No. 2006-317302, filed Nov. 24, 2006, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

The DRAM has memory cells, each of which may have a pair of a single transistor for selecting a memory cell and a single capacitor. In general, the transistor and the capacitor may be connected to each other through one or more contact plugs.

The capacitor may be formed in a hole such as a capacitor-hole in an insulating film such as an inter-layer insulator. The capacitor may include a bottom electrode, a capacitive insulating film, and a top electrode. The bottom electrode contacts with a capacitance contact plug. The capacitance contact plug may be positioned under the bottom electrode. The capacitance contact plug contacts with a cell contact plug. The cell contact plug may be positioned under the capacitance contact plug. The cell contact plug is connected to the transistor. In other words, the transistor is connected through the cell contact plug and the capacitance contact plug to the capacitor.

Increasing the degree of integration of the DRAM needs the shrinkage of each memory cell. The shrinkage of each memory cell needs to limit the plan-area in which the capacitor is present. The limited plan-area for the capacitor may result in reduced capacity of the capacitor. The reduction in the capacity of the capacitor may make it difficult for the conventional DRAM to ensure the normal memory operation thereof There was an issue of how to ensure the necessary capacity of the capacitor of each memory cell when each memory cell is shrunken. The limited plan-area for the capacitor needs increasing the height or vertical dimension of the capacitor in order to ensure the necessary capacity of the capacitor. The increased height or vertical dimension of the capacitor needs the increased thickness of the insulating film or inter-layer insulator having a capacitor hole of a high aspect ratio in which the capacitor is formed. Atypical example of the increased thickness of the insulating film or inter-layer insulator may be about 3000 nanometers.

The capacitor hole of the high aspect ratio may decrease in horizontally sectioned area as the depth thereof becomes deeper. In other words, the bottom of the capacitor hole is smaller in horizontally sectioned area than the top thereof The smaller sectioned area of the bottom of the capacitor hole results in a smaller contact area between the bottom electrode and the capacitor contact plug. Decreasing the contact area between the bottom electrode and the capacitor contact plug may increase contact resistance between the bottom electrode and the capacitor contact plug. Increasing the contact resistance may inhibit desired high performance of the DRAM.

The following descriptions are concerned with the issues caused by decreasing the contact area between the bottom electrode of the capacitor and the capacitor contact plug which contacts with the bottom electrode.

FIG. 5 is a fragmentary cross sectional elevation view illustrating a conventional DRAM having capacitors. Cell contact plugs 105 contact with transistors for selecting cells, wherein the transistors are not illustrated. Capacitor contact plugs 104 are formed in an inter-layer insulator 103. The capacitor contact plugs 104 contact with the cell contact plugs 105. An inter-layer insulator 102 is provided over the inter-layer insulator 103 and the capacitor contact plugs 104. An inter-layer insulator 100 is provided over the inter-layer insulator 102. Capacitor holes are formed in the stack of the inter-layer insulators 102 and 100. The capacitor holes reach the top surfaces of the capacitor contact plugs 104. Capacitors are provided in the capacitor holes. Each capacitor includes a bottom electrode 106, a capacitive insulating film 107 and a top electrode 108. The bottom electrode 106 is provided on the bottom and side walls of each capacitor hole, so that the bottom electrode contacts with the capacitor contact plug 104. The capacitive insulating film 107 is provided on the bottom electrode 106 and the top surface of the inter-layer insulator 100. The capacitive insulating film 107 is common to the capacitors. The top electrode 108 is provided on the capacitive insulating film 107 so that the top electrode 108 is separated from the bottom electrode 106 by the capacitive insulating film 107.

As shown in FIG. 5, the capacitor holes are coaxially misaligned to the capacitor contact plugs 104 even the bottom electrodes 106 contact with the capacitor contact plug 104. The coaxial misalignment of the capacitor holes to the capacitor contact plugs 104 reduces a contact area A2 between each capacitor and the corresponding capacitor contact plug 104.

FIG. 6 is a fragmentary cross sectional elevation view illustrating the capacitor holes of the conventional DRAM having capacitors. In the inter-layer insulator 100, the capacitor holes 101 are formed. The inter-layer insulator 100 may in general be made of silicon oxide. The known anisotropic etching process can be used to form capacitor holes 101 in the silicon oxide inter-layer insulator. The anisotropic etching process uses, as a main etchant, fluorine ions that are field-accelerated in high frequency plasma.

The capacitor holes 101 may in general have a center axis which is vertical to the surface of the semiconductor substrate on which the DRAM is formed. In the anisotropic etching process, fluorine ions are field-accelerated in the direction vertical to the surface of the semiconductor substrate. In some cases, field distribution in the capacitor holes 101 may vary so as to change the acceleration direction of fluorine ions. The orbit of the field-accelerated fluorine ions may have a curvature but be not straight. In this case, the capacitor holes 101 as formed may have a curvature B. The curvature B of the capacitor holes 101 may further reduce the contact area between the bottom electrode 106 and the capacitor contact plug 104 in addition to the above-described misalignment between the capacitor holes 101 and the capacitor contact plugs 104. Further reduction of the contact area may further increase the contact resistance between the capacitor and the capacitor contact plugs 104.

FIG. 7 is a fragmentary cross sectional elevation view illustrating the capacitor holes of the other conventional DRAM having capacitors. Each capacitor contact plug in the capacitor contact hole 101 has a contact pad that is wider than other portion. The contact pad is greater in horizontally sectioned area than the pother portion. The contact pad provides larger contact area A4 with the bottom electrode 106 in the capacitor hole.

The contact pad also provides larger allowance for misalignment between the capacitor hole and the capacitor contact plug under the condition for ensuring the minimum necessary contact area A4. The contact pad is suitable for increasing the density of the memory cells.

The capacitor contact plugs 101 having contact pads are made of silicon. If the bottom electrodes of the capacitors are made of a metal, a metal barrier layer needs to be interposed between the metal bottom electrode and the silicon contact pad in order to prevent reaction of silicon with the metal. Further, a silicide layer needs to be formed between the metal barrier layer and the silicon contact pad in order to reduce the contact resistance between the metal barrier layer and the silicon contact pad. The metal barrier layer may be made of titanium nitride. The silicide layer may be made of titanium silicide.

The metal barrier layer and the silicide layer may be formed as follows. Capacitor holes 101 are formed in an inter-layer insulator 100 so that parts of the top surfaces of the contact pads of the silicon capacitor contact plugs are shown through the capacitor holes 101. A chemical vapor deposition (CVD) process is carried out to supply titanium on the surfaces of the silicon contact pads, and a silicidation reaction is caused to form titanium silicide films on the surfaces of the silicon contact pads. Subsequently, metal barrier layers of titanium nitride are formed on the titanium silicide films. When the capacitor holes 101 have a high aspect ratio or a greater depth, an insufficient amount of titanium may be supplied on the surface of each silicon contact pad, thereby causing an abnormal silicidation reaction. As a result, a desired or intended silicide layer can not be formed.

FIG. 8 is a fragmentary cross sectional elevation view illustrating the capacitor holes of the other conventional DRAM having capacitors. High aspect ratio or larger depth of the capacitor holes may cause insufficient amount of titanium to be supplied on the bottoms of the capacitor holes, thereby forming undesired or unintended silicide layers of off-stoichiometric composition on the surfaces of the silicon contact pads. The silicide layers of off-stoichiometric composition may be highly resistive. Further, silicon migration can be caused, thereby forming voids on the surfaces of the silicon contact pads. Such voids may cause bad connection between the bottom electrode 106 and the silicon contact pads. The likelihood of causing these problems may depend upon the depth of the capacitor holes 101.

Japanese Unexamined Patent Application, First Publication, No. 2002-083881 discloses a conventional technique to prevent the last-mentioned problem with the off-stoichiometric composition of the silicide layers. The conventional technique is to avoid the above-described abnormal silicidation that results in off-stoichiometric composition of the silicide layers. After the capacitor contact plug is formed in a lower inter-layer insulator, a metal barrier layer including a stack of TiN/Ti layers is formed on the surface of the capacitor contact plug. Then, an upper inter-layer insulator is formed over the lower inter-layer insulator and a capacitor hole is formed in the upper inter-layer insulator, wherein the capacitor hole reaches the metal barrier layer.

The contact pad of the capacitor contact plug increases the contact area between the bottom electrode and the capacitor contact plug. When the bottom electrode is made of a metal or a metal compound, the abnormal silicidation reaction can be caused thereby making it difficult to ensure the electronic connection between the capacitor contact plug and the bottom electrode of the capacitor.

In accordance with the conventional technique disclosed in Japanese Unexamined Patent Application, First Publication, No. 2002-083881, the barrier layer covering the surface of the contact plug can prevent abnormality of silicidation reaction. This structure may, however, not prevent the other problem with misalignment between the capacitor contact plug and the capacitor hole. As described above, the misalignment decreases the contact area between the capacitor contact plug and the bottom electrode of the capacitor, thereby making it difficult to ensure the minimum necessary contact area for obtaining sufficiently reduced contact resistance between the capacitor contact plug and the bottom electrode of the capacitor.

In accordance with the conventional method of forming a capacitor having a bottom electrode of a metal or a metallic compound which is connected to a capacitor contact plug, it is not easy both to prevent the abnormality of silicidation reaction on the interface between the capacitor contact plug and the bottom electrode of the capacitor and to ensure a sufficiently large contact area between them and reduce the contact resistance between them. This results in decreasing the yield of manufacturing the semiconductor device.

In view of the above, it will be apparent to those skilled in the art from this disclosure that there exists a need for an improved semiconductor device and/or method for forming the same. This invention addresses this need in the art as well as other needs, which will become apparent to those skilled in the art from this disclosure.

SUMMARY OF THE INVENTION

Accordingly, it is a primary object of the present invention to provide a semiconductor device free from the above problems or disadvantages.

It is another object of the present invention to provide a semiconductor device including a capacitor that has a bottom electrode of a metal or a metallic compound which is connected to a capacitor contact plug such that it is easy both to prevent the abnormality of silicidation reaction on the interface between the capacitor contact plug and the bottom electrode of the capacitor and to ensure a sufficiently large contact area between them and reduce the contact resistance between them, while keeping a high yield of manufacturing the semiconductor device.

It is a further object of the present invention to provide a method of forming a semiconductor device free from the above problems or disadvantages.

It is a still further object of the present invention to provide a method of forming a semiconductor device including a capacitor that has a bottom electrode of a metal or a metallic compound which is connected to a capacitor contact plug such that it is easy both to prevent the abnormality of silicidation reaction on the interface between the capacitor contact plug and the bottom electrode of the capacitor and to ensure a sufficiently large contact area between them and reduce the contact resistance between them, while keeping a high yield of manufacturing the semiconductor device.

In accordance with a first aspect of the present invention, a semiconductor device may include, but is not limited to, the following elements. A MOS transistor having source and drain regions are provided in a semiconductor substrate. A first inter-layer insulator is provided over the MOS transistor. The first inter-layer insulator has first contact holes that reach the source and drain regions. Cell contact plugs are provided in the first contact holes. The cell contact plugs contact with the source and drain regions. A second inter-layer insulator is provided over the first inter-layer insulator and the cell contact plugs. The second inter-layer insulator has second contact holes that reach the cell contact plugs. Contact plugs each have first and second portions. The first portion is in the second contact hole. The second portion extends over the first second inter-layer insulator. Metal barrier layers cover the upper surfaces of the second portions of the contact plugs. Capacitors each have a bottom electrode layer, a capacitive insulating layer and a top electrode layer. The bottom electrode layers each have a contact portion that contacts with the metal barrier layer.

The contact plugs may be made of polysilicon.

The second portion of the contact plug may be larger in the area in plan view than the contact portion of the bottom electrode layer.

The metal barrier layer may have a single layered structure that includes one of a tungsten nitride layer and a titanium nitride layer.

The metal barrier layer may include one of: a first multi-layered structure of a titanium nitride layer and a titanium silicide layer; a second multi-layered structure of a tungsten layer and a tungsten nitride layer; a third multi-layered structure of a tungsten nitride layer and a tungsten silicide layer; a fourth multi-layered structure of a tungsten layer, a tungsten nitride layer and a tungsten silicide layer; and a fifth multi-layered structure of a tungsten layer, a titanium nitride layer and a titanium silicide layer.

The metal barrier layer may have a single layered structure that includes one of a titanium silicide layer, a cobalt silicide layer, and a tungsten silicide layer.

In accordance with a second aspect of the present invention, a semiconductor device may include, but is not limited to, a first insulator, a first contact plug of polysilicon, a metal barrier layer, and a first metal electrode layer. The first insulator may have a first contact hole. The first contact plug has first and second portions. The first portion is in the first contact hole. The second portion extends over the first insulator. The first portion has a first dimension defined in a direction parallel to a surface of the first insulator. The second portion has a second dimension defined in the direction parallel to the surface of the first insulator. The second dimension is greater than the first dimension. The metal barrier layer contacts with at least an upper surface of the second portion of the first contact plug. The metal barrier layer has a metal-polysilicon interface with the first contact plug of polysilicon. The metal-polysilicon interface has a first area. The first metal electrode layer has a contact portion that contacts with a part of the metal barrier layer. The first metal electrode layer is separated by the metal barrier layer from the first contact plug of polysilicon. The first metal electrode layer has a metal-metal interface with the metal barrier layer. The metal-metal interface has a second area that is smaller than the first area. The contact portion of the first metal electrode has a third dimension defined in the direction parallel to the surface of the first insulator. The third dimension of the contact portion of the first metal electrode layer is smaller than the first dimension.

The metal barrier layer may contact with the upper surface and side edge of the second portion of the first contact plug.

The semiconductor may further include, but is not limited to, a semiconductor substrate, a diffusion region in the semiconductor substrate, and a second contact plug of polysilicon. The second contact plug has third and fourth portions. The third portion contacts with the diffusion region. The fourth portion contacts with the first portion of the first contact plug.

The third portion has a third dimension defined in the direction parallel to the surface of the first insulator. The fourth portion has a fourth dimension defined in the direction parallel to the surface of the first insulator. The fourth dimension is greater than the third dimension and the first dimension.

In accordance with a third aspect of the present invention, a method of forming a semiconductor device may include, but is not limited to the following processes. A MOS transistor is formed on a semiconductor substrate. The MOS transistor has source and drain regions in the semiconductor substrate. A first inter-layer insulator is formed over the MOS transistor. First contact holes are formed in the first inter-layer insulator. The first contact holes reach the source and drain regions. Cell contact plugs of polysilicon are formed in the first contact holes, the cell contact plugs contacting with the source and drain regions. A second inter-layer insulator is formed over the cell contact plugs and the first inter-layer insulator. Second contact holes are formed in the second inter-layer insulator. The second contact holes reach the cell contact plugs. Contact plugs of polysilicon are formed in the second contact holes and over the second inter-layer insulator. The contact plugs each have first and second portions. The first portion is in the contact hole. The first portion contacts with the cell contact plugs. The second portion extends over the second inter-layer insulator. The second portions are covered by metal barrier layers. Capacitors are formed over the metal barrier layers. The capacitors each have a bottom electrode layer that contact with the metal barrier layer, a capacitive insulating film, and a top electrode that is separated by the capacitive insulating film from the bottom electrode layer.

The contact plugs may be made of polysilicon.

A first interface between the second portion and the metal barrier layer may be larger in area than a second interface between the metal barrier layer and the bottom electrode layer.

The metal barrier layer may have a single layered structure that includes one of a tungsten nitride layer and a titanium nitride layer.

The metal barrier layer may include one of: a first multi-layered structure of a titanium nitride layer and a titanium silicide layer; a second multi-layered structure of a tungsten layer and a tungsten nitride layer; a third multi-layered structure of a tungsten nitride layer and a tungsten silicide layer; a fourth multi-layered structure of a tungsten layer, a tungsten nitride layer and a tungsten silicide layer; and a fifth multi-layered structure of a tungsten layer, a titanium nitride layer and a titanium silicide layer.

The metal barrier layer may have a single layered structure that includes one of a titanium silicide layer, a cobalt silicide layer, and a tungsten silicide layer.

The step of forming the contact plugs may include: forming a polysilicon film in the second contact holes and over the second inter-layer insulator; forming a metal layer over on the polysilicon film; and selectively etching the metal layer and the polysilicon film to form the contact plugs and the metal barrier layers.

The step of forming the contact plugs may include: forming a polysilicon film in the second contact holes and over the second inter-layer insulator; selectively etching the polysilicon film to form the contact plugs; forming a metal layer on the second portions of the contact plugs and over the second inter-layer insulator; causing a silicidation reaction on an interface between the metal layer and the surfaces of the second portions of the contact plugs; and removing unsilicided portions of the metal layer, while leaving silicided portions of the metal layer to form the metal barrier layers.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1:
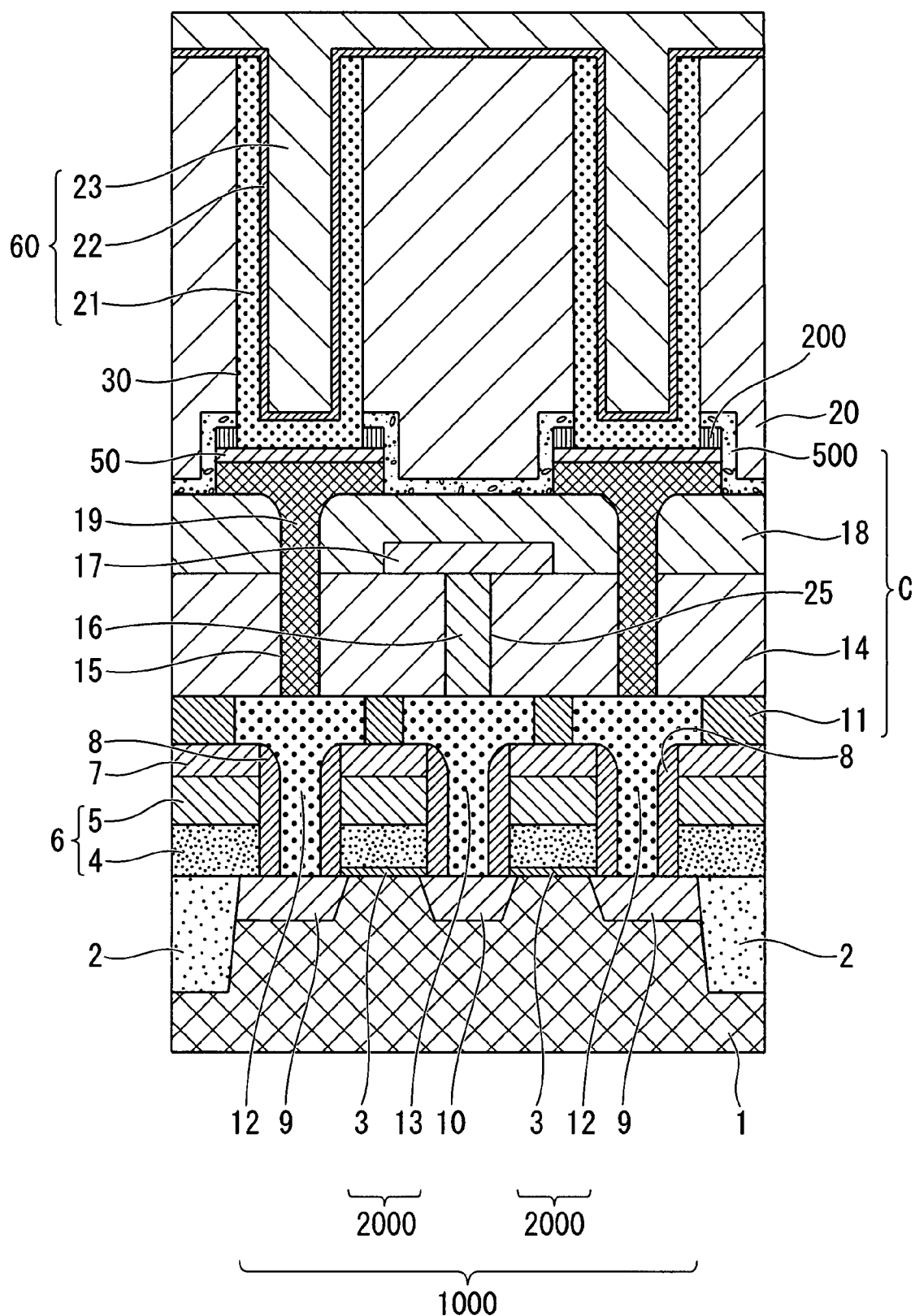
FIG. 1 is a fragmentary cross sectional elevation view illustrating a semiconductor device in accordance with a first embodiment of the present invention.

A semiconductor device such as a DRAM of this first embodiment will be described with reference to the drawings. FIG. 1 is a fragmentary cross sectional elevation view illustrating a semiconductor device in accordance with a first embodiment of the present invention.

A semiconductor substrate 1 is made of a semiconductor such as silicon doped with a p-type impurity such as boron.

A device isolation region 2 is selectively provided in the semiconductor substrate 1. The device isolation region 2 defines or surrounds an active region so called to as a transistor formation region for forming a transistor that selects a memory cell. The device isolation region 2 can be formed by a shallow trench isolation method.

In the transistor formation region, gate insulating films 3 are provided over the surface of the semiconductor substrate 1. The gate insulating films 3 may be made of silicon oxide. In this case, the gate oxide films 3 can be formed by a thermal oxidation method.

Gate electrodes 6 are provided on the gate insulating films 3. Each of the gate electrodes 6 may have a multi-layered structure of a polycrystalline silicon film 4 and a metal film 5. The polycrystalline silicon film 4 is positioned over the gate insulating film 3 and under the metal film 5. The polycrystalline silicon film 4 may be a doped polycrystalline silicon film that is formed by a chemical vapor deposition process, while introducing an impurity into polysilicon. The metal layer 5 may be made of a refractory metal such as tungsten (W) or tungsten silicide (WSi).

Insulating films 7 are provided over the gate electrodes 6, namely, over the metal films 5. The insulating films 7 may be made of silicon nitride (SiN). Side walls 8 are provided on side walls of each stack of the gate insulating film 3, the gate electrode 6, the insulating film 7. The side walls 8 may be made of silicon nitride.

Source and drain diffusion layers 9 and 10 are selectively formed in upper regions of the semiconductor substrate 1. The drain diffusion layer 10 is separated by channel regions from the source diffusion layers 9, wherein the channel regions are positioned under the gate insulating films 3 that are positioned under the gate electrodes 6. The structure of the gate insulating film 3, the gate electrode 6, the insulating film 7 and the side walls 8 will be called to as a gate structure.

An inter-layer insulator 11 is provided over the semiconductor substrate 1 and the gate structures. The inter-layer insulator 11 has contact holes which are self-aligned to the gate structures, namely to the insulating films 7 and the side walls 8. Cell contact plugs 12 and 13 are provided in the contact holes in the inter-layer insulator 11. The cell contact plugs 12 contact with the source diffusion layers 9. The cell contact plug 13 contacts with the drain diffusion layer 10. The cell contact plugs 12 and 13 may be made of an impurity doped polysilicon.

Each of the cell contact plugs 12 and 13 has a horizontally expanded upper portion that extends over parts of the gate structures, namely over the side walls and parts of the insulating films. Each of the cell contact plugs 12 and 13 has a lower portion that is defined between two adjacent gate structures, namely between the side walls. The lower portion contacts with the source or drain diffusion layer 9 or 10. The lower portion is narrower than the horizontally expanded upper portion. The top surface of the horizontally expanded upper portion is greater in area than the bottom surface of the lower portion. Namely, each of the cell contact plugs 12 and 13 has a larger top surface area than the contact area contacting with the source or drain diffusion layer 9 or 10.

The cell contact plugs 12 and 13 are separated from each other by the gate structure and the inter-layer insulator 11. The top surfaces of the horizontally expanded upper portions of the cell contact plugs 12 and 13 are not covered by the inter-layer insulator 11.

An inter-layer insulator 14 is provided over the inter-layer insulator 11 and the cell contact plugs 12 and 13. The inter-layer insulator 14 has a bit line contact hole 25 which reaches the cell contact plug 13. A bit line contact plug 16 is provided in the bit line contact hole 25. The bit line contact plug 16 contacts with the cell contact plug 13. The bit line contact plug 16 may have a multi-layered metal structure that can be formed by a chemical vapor deposition process and a subsequent chemical mechanical polishing process. For example, a titanium film, a titanium nitride film, and a tungsten film can be formed in this order by the chemical vapor deposition process. The multi-layered structure is then planarized by the chemical mechanical polishing process, thereby forming the bit line contact plug 16 in the bit line contact hole 25. The top of the bit line contact plug 16 is leveled to the top of the inter-layer insulator 14.

A bit line layer 17 is provided over the bit line contact plug 16 and the inter-layer insulator 14. The bit line layer 17 contacts with the bit line contact plug 16. The bit line layer 17 is electrically connected through the bit line contact plug 16 and the cell contact plug 13 to the drain diffusion layer 10. The bit line layer 17 may be made of a metal such as tungsten.

An inter-layer insulator 18 is provided over the inter-layer insulator 14 and the bit line layer 17. The stack of the inter-layer insulators 14 and 18 has capacitor contact holes 15 that reach the cell contact plugs 12. Capacitor contact plugs 19 are provided in the capacitor contact holes 15. The capacitor contact plugs 19 may be made of an impurity-doped polysilicon. Each of the capacitor contact plugs 19 has a horizontally expanded upper portion which extends over the inter-layer insulator 18. Namely, the horizontally expanded upper portion is positioned above the inter-layer insulator 18. Each of the capacitor contact plugs 19 has a narrow portion that is positioned under the horizontally expanded upper portion. The narrow portion is disposed in the capacitor contact hole 15. The narrow portion contacts with the cell contact plug 12. The top surface of the horizontally expanded upper portion is greater in area than the contact area between the narrow portion and the cell contact plug 12.

Metal barrier layers 50 are provided on the top surfaces of the horizontally expanded upper portions of the capacitor contact plugs 19. Each of the metal barrier layers 50 may have a single-layered structure or a multi-layered structure. In some cases, each of the metal barrier layers 50 may be a single layered structure of a tungsten nitride layer or a titanium nitride layer. In other cases, each of the metal barrier layers 50 may be a multi-layered structure of a titanium nitride layer and a titanium silicide layer over the titanium nitride layer. In still other cases, each of the metal barrier layers 50 may be another multi-layered structure of a tungsten layer and a tungsten nitride layer over the tungsten layer. In other cases, each of the metal barrier layers 50 may be still another multi-layered structure of a tungsten nitride layer and a tungsten silicide layer over the tungsten nitride layer. In other cases, each of the metal barrier layers 50 may be yet another multi-layered structure of a tungsten layer, a tungsten nitride layer over the tungsten layer, and a tungsten silicide layer over the tungsten nitride layer. In other cases, each of the metal barrier layers 50 may be further another multi-layered structure of a tungsten layer, a titanium nitride layer over the tungsten layer, and a titanium silicide layer over the titanium nitride layer. In other cases, each of the metal barrier layers 50 may be a single layered structure of a titanium silicide layer, a cobalt silicide layer, or a tungsten silicide layer.

Hard masks 200 are disposed over the top surface of a side region of the metal barrier layers 50. An etching stopper layer 500 is provided over the inter-layer insulator 18 and the hard masks 200.

An inter-layer insulator 20 is provided on the etching stopper layer 500. The inter-layer insulator 20 is positioned over the metal barrier layers 50 and the inter-layer insulator 18.

In some cases, each of the inter-layer insulators 11, 14, 18, and 20 may be made of silicon oxide. In other cases, each of the inter-layer insulators 11, 14, 18, and 20 may be made of phosphosilicate glass (PSG) or borophosphosilicate glass (BPSG).

Capacitor holes 30 are formed in the inter-layer insulator 20. The capacitor holes 30 penetrate the etching stopper layer 500 and the hard mask 200 and reach the metal barrier layers 50 under which the capacitor contact plugs 19 are positioned.

A bottom electrode 21 is provided on the side walls and bottom of each of the capacitor holes 30. The bottom electrode 21 contacts with the metal barrier layer 50. The bottom electrode 21 may be made of a metal layer such as titanium nitride. The bottom electrode 21 in each capacitor contact hole 30 is electrically connected through the metal barrier layer 50, the capacitor contact plug 19 and the cell contact plug 12 to the source diffusion layer 9. A capacitive insulating film 22 is provided on the bottom electrodes 21 and the top surface of the inter-layer insulator 20. The capacitive insulating film 22 is common to plural capacitors. A top electrode 23 is provided on the capacitive insulating film 22. The top electrode 23 is electrically separated from the bottom electrodes 21 by the capacitive insulating film 22. Capacitors 60 are provided in the capacitor holes 30. Each of the capacitors 60 includes the bottom electrode 21, the capacitive insulating film 22, and the top electrode 23. Each of the capacitors 60 has a metal-insulator-metal structure.

Each of the capacitor contact plugs 19 has an upper portion that has a larger horizontal size than the other portion. The metal barrier layer 50 is provided on the entirety of the upper surface of the upper portion of the capacitor contact plug 19. The metal barrier layer 50 has the side edge that is aligned to the side edge of the upper portion of the contact plug 19. The metal-polysilicon interface between the metal barrier layer 50 and the capacitor contact plug 19 has a first area. The bottom electrode 21 of the capacitor 60 contacts with a part of the upper surface of the metal barrier layer 50. The bottom electrode 21 is separated by the metal barrier layer 50 from the capacitor contact plug 19. The bottom electrode 21 has a lower portion that contacts with the metal barrier layer 50. The lower portion of the bottom electrode 21 is smaller in horizontal size than the metal barrier layer 50 and the upper portion of the contact plug 19. The metal-metal interface between the bottom electrode 21 and the metal barrier layer 50 has a second area that is smaller than the first area. Namely, the metal-polysilicon interface is larger in area than the metal-metal interface. The side edge of the lower portion of the bottom electrode 21 is positioned inside the aligned side edge of the metal barrier layer 50 and the upper portion of the contact plug 19.

This structure ensures that the metal-metal interface between the bottom electrode 21 and the metal barrier layer 50 is substantially identical in the area to the metal-polysilicon interface between the metal barrier layer 50 and the upper portion of the capacitor contact plug 19, even if the capacitor 60 is misaligned to the capacitor contact plug 19 as long as the side edge of the lower portion of the bottom electrode 21 is positioned inside the aligned side edge of the metal barrier layer 50 and the upper portion of the contact plug 19. Namely, the side edge of the lower portion of the bottom electrode 21 can be positioned inside the aligned side edge of the metal barrier layer 50 and the upper portion of the contact plug 19 even if the capacitor 60 is misaligned to the capacitor contact plug 19. This structure can provide a lowly resistive contact between the bottom electrode 21 and the capacitor contact plug 19.

Figure 3:
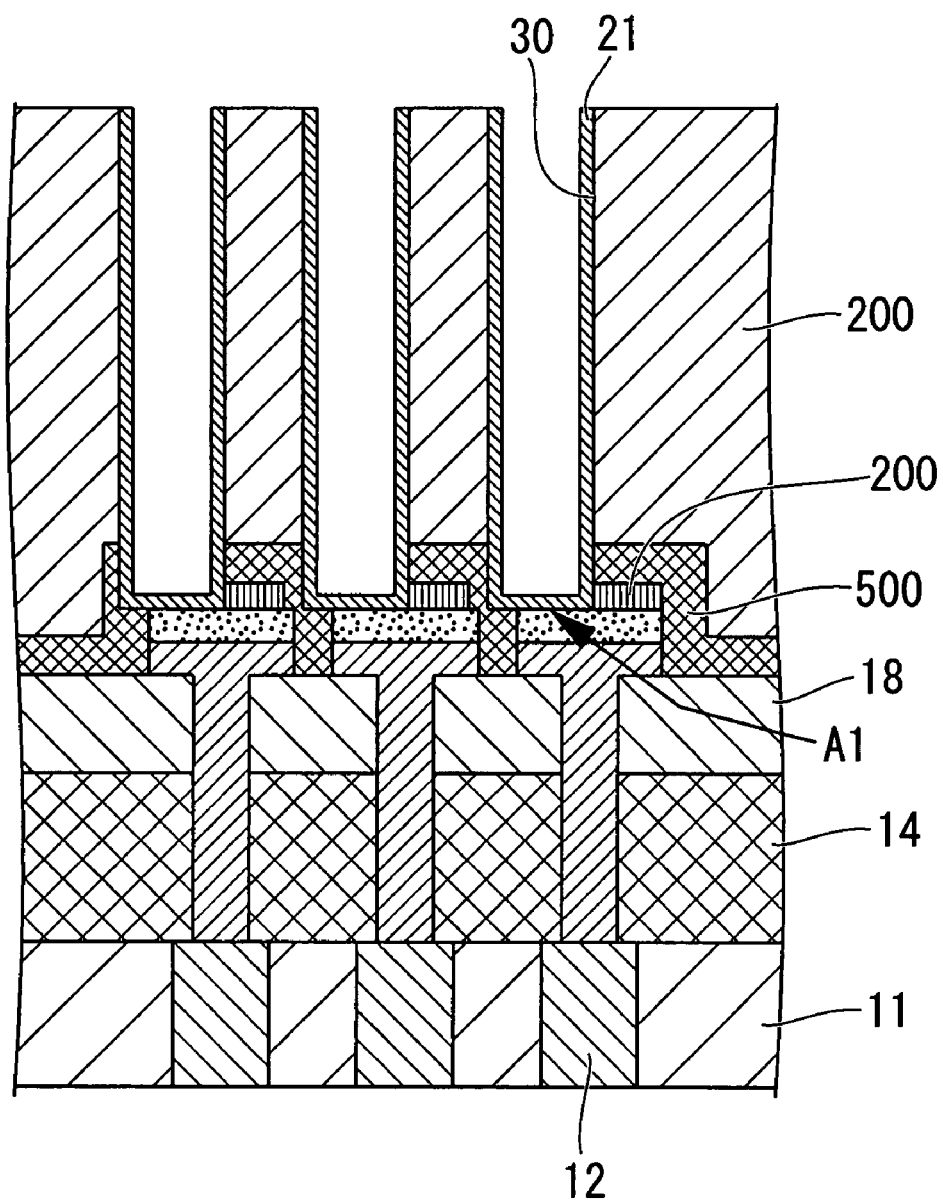
FIG. 3 is a fragmentary cross sectional elevation view illustrating a misaligned contact structure between a capacitor contact plug and a bottom electrode that is largely misaligned to the capacitor contact plug in the step involved in a fabrication processes for the semiconductor device of FIG. 1.

FIG. 3 is a fragmentary cross sectional elevation view illustrating the misaligned contact structure between the capacitor contact plug 19 and the bottom electrode 21 that is largely misaligned to the capacitor contact plug 19 in the step involved in the fabrication processes for the semiconductor device of FIG. 1. The above-described structure may also ensure the necessary contact area between the capacitor contact plug 19 and the bottom electrode 21 even if the capacitor 60 is largely misaligned to the capacitor contact plug 19 so that the side edge of the lower portion of the bottom electrode 21 can be positioned outside the aligned side edge of the metal barrier layer 50 and the upper portion of the contact plug 19.

A method of forming the above-described DRAM will be described with reference to the drawings. FIGS. 2A through 2D are fragmentary cross sectional elevation views illustrating a selected area C shown in FIG. 1 that includes capacitor contact plugs, in sequential steps involved in a method of forming the DRAM memory cell of FIG. 1. The DRAM includes the memory cell area shown in FIG. 1 and a peripheral circuit area that is not illustrated in FIG. 1. The peripheral circuit area and the memory cell area are formed in the common processes. The following descriptions will be concerned with the process for forming the memory cell area.

Since FIGS. 2A through 2D illustrate the selected area C that includes the capacitor contact plugs but does not include the MOS transistors, the cell contact plugs 12 and 13 and the capacitors 60.

As shown in FIG. 1, a semiconductor substrate 1 made of a p-type single crystal silicon is prepared. A shallow trench isolation process is carried to form device isolation films 2 in the semiconductor substrate 1. The device isolation films 2 define a transistor formation region of the main face of the semiconductor substrate. The transistor formation region is a region for forming transistors thereon.

A thermal oxidation process is carried out to oxidize the surface of the semiconductor substrate 1, thereby forming a gate insulating film 3 on the transistor formation region. The gate insulating film 3 may have a thickness of 4 nanometers. The gate insulating film 3 may be formed of silicon oxide.

A chemical vapor deposition process is carried out using monosilane ($SiH_4$) and phosphine ($PH_3$) as source gases, thereby forming a polycrystalline silicon film 4 over the gate insulating film 3 and the device isolation films 2. The polycrystalline silicon film 4 has been doped with an n-type impurity, for example, phosphorous. The polycrystalline silicon film 4 has a thickness of 70 nanometers.

A sputtering process is carried out to deposit a refractory metal on the polycrystalline silicon film 4, thereby forming a metal layer 5. Typical examples of the refractory metal may include, but are not limited to, tungsten, tungsten nitride, and tungsten silicide. The metal layer 5 may have a thickness of 50 nanometers.

A plasma enhanced chemical vapor deposition process is carried out using monosilane and ammonium ($NH_3$), thereby forming an insulating film 7 of silicon nitride on the metal layer 5. The insulating film 7 may have a thickness of 70 nanometers.

A resist is applied on the insulating film 7. A photolithography process is carried out by using a mask to form a resist pattern over the insulating film 7.

An anisotropic etching process is carried out using the resist pattern as a mask to selectively etch the insulating film 7. The used resist pattern is removed. The insulating film 7 is used as a mask to selectively etch the stack of the metal layer 5 and the polycrystalline silicon film 4, thereby forming gate electrodes 6. Each of the gate electrodes 6 has the double-layered structure of the metal layer 5 and the polycrystalline silicon film 4. As a result, gate structures are formed, each of which includes the stack of the gate insulating film 3, the gate electrode 6 and the insulating film 7.

A chemical vapor deposition process is carried out to deposit a silicon nitride film having a thickness of 40 nanometers. An etch back process is then carried out to etch-back the silicon nitride film, thereby forming side walls 8 of silicon nitride on side edges of each of the gate structures.

An ion-implantation process is carried out using the gate electrodes 6 and the side walls 8 as masks so as to selectively introduce an n-type impurity into the transistor formation region of the semiconductor substrate 1. The ion-implantation process may be carried out under the conditions of implantation energy in the range of 15 keV to 30 keV and a dose in the range of $5E12$ $cm^{-2}$ to $1E13$ $cm^{-2}$. A typical example of the n-type impurity may be, but is not limited to, arsenic. An annealing process is carried out in a nitrogen atmosphere at a temperature in the range of 900° C. to 1000° C. for 1 minute, thereby diffusing implanted impurity and forming source and drain diffusion layers 9 and 10 in the semiconductor substrate 1. As a modification, it is possible to carry out the above-described ion-implantation under the above-described conditions to form the source and drain diffusion layers before the side walls 8 are formed on the side edges of the gate structures. As a result, the transistor structure is formed in the transistor formation region.

A chemical vapor deposition process is carried out using monosilane ($SiH_4$) and phosphine ($PH_3$) as source gases, thereby forming a polycrystalline silicon film over the gate structures and the device isolation films 2. The polycrystalline silicon film has been doped with an n-type impurity, for example, phosphorous. The polycrystalline silicon film has a thickness of 30 nanometers. A chemical mechanical polishing process is carried out to planarize the polycrystalline silicon film, thereby forming an inter-layer insulator 11 which covers the gate structures. The inter-layer insulator 11 has a thickness such that the planarized top surface thereof is distanced by about 250 nanometers from the top surface of the semiconductor substrate 1.

A photo-resist is applied on the polycrystalline silicon film so that the photo-resist has a thickness of 300 nanometers. A photo-lithography process is carried out using a mask to form a photo-resist pattern. An anisotropic etching process is carried out using the photo-resist pattern as a mask to selectively remove the polycrystalline silicon film, thereby forming cell contact plugs 12 and 13 that are separate by gaps from each other. The cell contact plugs 12 contact with the source diffusion layers 9. The cell contact plug 13 contacts with the drain diffusion layer 10. The photo-resist pattern is then removed.

A plasma enhanced chemical vapor deposition process is carried out, thereby forming an inter-layer insulator 11. The inter-layer insulator 11 may be made of silicon oxide. The inter-layer insulator 11 has a thickness of 450 nanometers. The inter-layer insulator 11 covers the cell contact plugs 12 and 13 and fills-up the gaps between the cell contact plugs 12 and 13. A chemical mechanical polishing process is carried out to planarize the inter-layer insulator 11 so that the top surfaces of the cell contact plugs 12 and 13 are exposed.

A plasma enhanced chemical vapor deposition process is carried out, thereby forming an inter-layer insulator 14 over the inter-layer insulator 11 and the cell contact plugs 12 and 13. The inter-layer insulator 11 may be made of silicon oxide. The inter-layer insulator 14 has a thickness of 300 nanometers. A photo-resist is applied on the inter-layer insulator 14. A photo-lithography process is carried out using a mask to form a photo-resist pattern. An anisotropic etching process is carried out using the photo-resist pattern as a mask to selectively remove the inter-layer insulator 14, thereby forming a bit-line contact hole 25 in the inter-layer insulator 14. The bit-line contact hole 25 reaches the top surface of the cell contact plug 13.

The photo-resist is removed. A chemical vapor deposition process is carried out to form a titanium layer on the bottom and side wall of the bit-line contact hole 25 and over the inter-layer insulator 14. A chemical vapor deposition process is carried out to form a titanium nitride layer on the titanium layer. A chemical vapor deposition process is carried out to form a tungsten layer on the titanium nitride layer, thereby forming a metal multilayer structure of the titanium layer, the titanium nitride layer, and the tungsten layer. A chemical mechanical polishing process is carried out to planarize the metal multilayer structure, thereby forming a bit-line contact plug 16 in the bit-line contact hole 25. The bit-line contact plug 16 is formed of the metal multilayer structure.

A metal layer is formed over the bit-line contact plug 16 and the inter-layer insulator 14. A photo-resist is applied on the metal layer. A photo-lithography process is carried out using a mask to form a photo-resist pattern. An anisotropic etching process is carried out using the photo-resist pattern as a mask to selectively remove the metal layer, thereby forming a bit line layer 17 which contacts with the bit-line contact plug 16. The bit line layer 17 is electrically connected through the bit-line contact plug 16 and the cell contact plug 13 to the drain diffusion layer 10.

The photo-resist is removed. A plasma enhanced chemical vapor deposition process is carried out to form an inter-layer insulator 18 of silicon oxide over the bit line layer 17 and the inter-layer insulator 14. The inter-layer insulator 18 has a thickness of 500 nanometers. A chemical mechanical polishing process is carried out to planarize the inter-layer insulator 18.

Figure 2A:
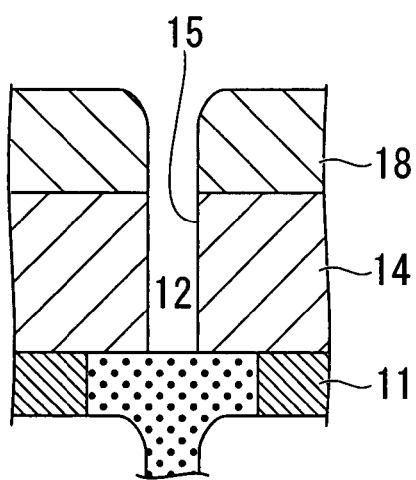
FIGS. 2A through 2D are fragmentary cross sectional elevation views illustrating a selected area C shown in FIG. 1 that includes capacitor contact plugs, in sequential steps involved in a method of forming the DRAM memory cell of FIG. 1.

A photo-resist is applied on the inter-layer insulator 18. A photo-lithography process is carried out using a mask to form a photo-resist pattern. An anisotropic etching process is carried out using the photo-resist pattern as a mask to selectively remove the inter-layer insulators 18 and 14, thereby forming capacitor contact holes 15 in the inter-layer insulators 18 and 14. The capacitor contact holes 15 reach the top surfaces of the cell contact plugs 12 as shown in FIG. 2A. A part of the top surface of each of the cell contact plugs 12 is exposed.

Figure 2B:
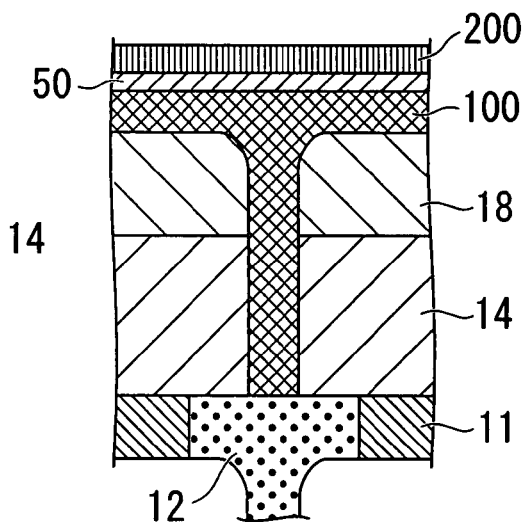

The photo-resist is removed. As shown in FIG. 2B, a chemical vapor deposition process is carried out, thereby forming an impurity doped polycrystalline silicon film 100 over the inter-layer insulator 18 and in the capacitor contact holes 15. The impurity doped polycrystalline silicon film 100 over the inter-layer insulator 18 has a thickness of 50 nanometers to 150 nanometers. A chemical mechanical polishing process is carried out to planarize the impurity doped polycrystalline silicon film 100.

A chemical vapor deposition process is carried out to form a titanium silicide layer having a thickness of 10 nanometers over the impurity doped polycrystalline silicon film 100. A chemical vapor deposition process is carried out to form a titanium nitride layer having a thickness of 20 nanometers over the titanium silicide layer. A chemical vapor deposition process is carried out to form a tungsten layer having a thickness of 50 nanometers over the titanium nitride layer, thereby forming a metal barrier layer 50 over the impurity doped polycrystalline silicon film 100. The metal barrier layer 50 has a multi-layered structure of the titanium silicide layer, the titanium nitride layer, and the tungsten layer. Instead of the chemical vapor deposition process, a sputtering process can be used to form the metal barrier layer 50.

A chemical vapor deposition process is carried out to form a hard mask layer 200 of silicon oxide over the metal barrier layer 50. The hard mask layer 200 has a thickness in the range of 50 nanometers to 150 nanometers. The hard mask layer 200 may be made of silicon nitride or amorphous carbon.

Figure 2C:
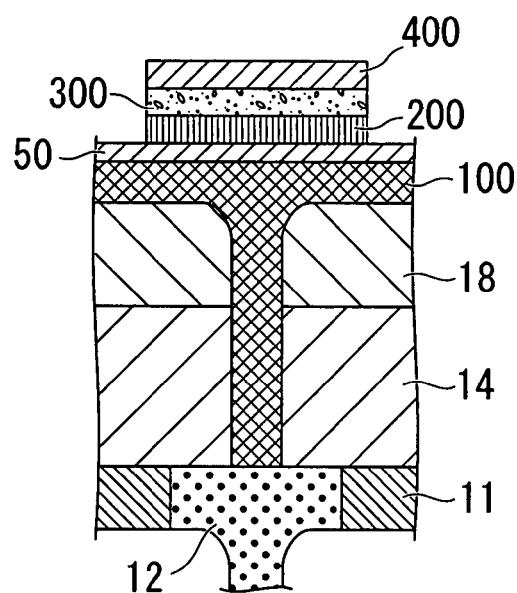

As shown in FIG. 2C, a bottom antireflective coating (BARC) layer 300 of an organic substance is applied on the hard mask layer 200. A photo-resist is applied on the BARC layer 300. A photo-lithography process is carried out using a mask to form a photo-resist pattern 400. A magnetron reactive ion etching (M-RIE) process is carried out using the photo-resist pattern 400 as a mask to selectively remove the BARC layer 300. The magnetron reactive ion etching (M-RIE) process is carried out using $CF_4$ as an etching gas under a pressure of 13.3 Pa (100 mTorr) at an RF power of 400 W and a frequency of 13.56 MHz.

A magnetron reactive ion etching (M-RIE) process is carried out using the photo-resist pattern 400 as a mask to selectively remove the hard mask layer 200. The magnetron reactive ion etching (M-RIE) process is carried out by feeding $CF_4$ at a flow rate of 40 sccm, $CHF_3$ at a flow rate of 100 sccm, and Ar at a flow rate of 200 sccm, under a pressure of 23.9 Pa (180 mTorr), by keeping the temperature of a wafer stage at 60° C. and applying an RF power of 1000 W at a frequency of 13.56 MHz.

The photo-resist pattern 400 and the BARC layer 300 are removed by oxygen plasma. Etching products are removed from the surface of the hard mask 200 by diluted HF.

Figure 2D:
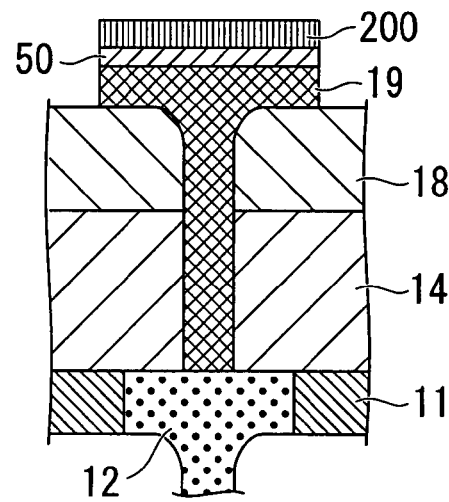

As shown in FIG. 2D, an inductively coupled plasma (ICP) source etcher is used, while using the hard mask 200, thereby selectively etching the metal barrier layer 50 and the impurity doped polycrystalline silicon film 100, thereby forming capacitor contact plugs 19 that contact with the cell contact plugs 12 which contact with the source diffusion layers 9.

The etching process for etching the metal barrier layer 50 is carried out by feeding $Cl_2$ at a flow rate of 30 sccm, $N_2$ at a flow rate of 40 sccm, and $SF_6$ at a flow rate of 80 sccm, under a pressure of 1.3 Pa (10 mTorr), by keeping the temperature of a wafer stage at 40° C. and applying a source power of 1000 W at a frequency of 13.56 MHz and an RF bias power of 100 W at a frequency of 13.56 MHz.

The etching process for etching the impurity doped polycrystalline silicon film 100 is carried out by feeding $Cl_2$ at a flow rate of 80 sccm, and HBr at a flow rate of 160 sccm, under a pressure of 1.1 Pa (8 mTorr), by keeping the temperature of a wafer stage at 40° C. and applying a source power of 800 W at a frequency of 13.56 MHz and an RF bias power of 100 W at a frequency of 13.56 MHz.

Etching products are removed from the surfaces of the hard masks 200 by diluted HF.

With reference back to FIG. 1, a low pressure chemical vapor deposition process is carried out to form a silicon nitride film 500 which covers the hard masks 200 and the inter-layer insulator 18.

A plasma enhanced chemical vapor deposition process is carried out to form an inter-layer insulator 20 of silicon oxide on the silicon nitride film 500. The inter-layer insulator 20 has a thickness of 3000 nanometers.

A photo-resist is applied on the inter-layer insulator 20. A photo-lithography process is carried out using a mask to form a photo-resist pattern. An anisotropic etching process is carried out using the photo-resist pattern as a mask to selectively remove the inter-layer insulator 20, thereby forming capacitor holes 30 in the inter-layer insulator 20. The capacitor holes 30 reach the silicon nitride film 500. Parts of the top surface of the silicon nitride film 500 are exposed. A further anisotropic etching process is carried out using the photo-resist pattern as a mask to selectively remove the silicon nitride film 500 so that the capacitor holes 30 reach the hard masks 200. Parts of the top surfaces of the hard masks 200 are exposed. A furthermore anisotropic etching process is carried out using the photo-resist pattern as a mask to selectively remove the hard masks 200 so that the capacitor holes 30 reach the metal barrier layers 50. Parts of the top surfaces of the metal barrier layers 50 are exposed.

The photo-resist pattern is removed. A chemical vapor deposition process is carried out to form a titanium nitride film on the bottoms and side walls of the capacitor holes 30 and over the inter-layer insulator 20. The titanium nitride film on the bottoms of the capacitor holes 30 contact with the metal barrier layers 50. A further chemical vapor deposition process is carried out to form a titanium film on the titanium nitride film, thereby forming a stack of the titanium nitride film and the titanium film on the bottoms and side walls of the capacitor holes 30 and over the inter-layer insulator 20. The stack of the titanium nitride film and the titanium film has a thickness of 30 nanometers. The capacitor holes 30 are not filled up by the stack of the titanium nitride film and the titanium film.

A photo-resist is applied on the inter-layer insulator 20. A photo-lithography process is carried out using a mask to form a photo-resist pattern. An anisotropic etching process is carried out using the photo-resist pattern as a mask to remove the stack of the titanium nitride film and the titanium film from the top surface of the inter-layer insulator 20, while leaving the stack of the titanium nitride film and the titanium film in the capacitor holes 30, thereby forming bottom electrodes 21 in the capacitor holes 30. Each of the bottom electrodes 21 is formed of the stack of the titanium nitride film and the titanium film. The photo-resist pattern is removed.

An atomic layer deposition process is carried out to form a capacitive insulating film 22 of aluminum oxide on the bottom electrodes 21 and the top surface of the inter-layer insulator 20. The capacitive insulating film 22 has a thickness of 6 nanometers.

A chemical vapor deposition process is carried out to form a metal layer of titanium nitride on the capacitive insulating film 22. The metal layer fills up the capacitor holes 30 and extends over the inter-layer insulator 20. The metal layer has a thickness of 30 nanometers. Optionally, it is possible that any further metal layer may be formed on the metal layer.

A photo-resist is applied on the metal layer. A photo-lithography process is carried out using a mask to form a photo-resist pattern. An anisotropic etching process is carried out using the photo-resist pattern as a mask to selectively remove the metal layer, thereby forming a top electrode 23 on the capacitive insulating film 22. The resist pattern is removed. As a result, the capacitors 60 are formed in the capacitor holes 30. The capacitors 60 may be cylindrically shaped. Each of the capacitors 60 has a metal-insulator metal structure which includes the bottom electrode 21, the capacitive insulating film 22 and the top electrode 23.

The above-described processes form the memory cell area of the semiconductor memory device. The peripheral circuit area can also be formed in similar processes to the above-described processes for forming the memory cell area.

As the shrinkage of the memory cell is increased, the contact resistance between the capacitive contact plug 19 and the bottom electrode 21 may be increased. One of the reasons why the contact resistance is increased due to increasing the shrinkage of the memory cell is the abnormal silicidation that is caused on the interface between the bottom electrode and the contact plug.

In accordance with this first embodiment of the present invention, the metal barrier layer 50 is interposed between the capacitor contact plug 19 and the bottom electrode 21 of the capacitor 60. Namely, the metal barrier layer 50 is formed on the capacitor contact plug 19, thereby forming a metal-polysilicon interface between the metal barrier layer 50 and the capacitor contact plug 19, before the bottom electrode 21 of the capacitor 30 is formed on the metal barrier layer 50, thereby forming a metal-metal interface between the bottom electrode 21 and the metal barrier layer 50. This structure including the capacitor contact plug 19 of polycrystalline silicon, the metal barrier layer 50 and the bottom electrode 21 of metal prevents that the contact resistance between the bottom electrode 21 and the capacitor contact plug 19 is increased due to the abnormal silicidation.

Each of the capacitor contact plugs 19 has an upper portion that has a larger horizontal size than the other portion. The metal barrier layer 50 is provided on the entirety of the upper surface of the upper portion of the capacitor contact plug 19. The metal barrier layer 50 has the side edge that is aligned to the side edge of the upper portion of the contact plug 19. The metal-polysilicon interface between the metal barrier layer 50 and the capacitor contact plug 19 has a first area. The bottom electrode 21 of the capacitor 60 contacts with a part of the upper surface of the metal barrier layer 50. The bottom electrode 21 is separated by the metal barrier layer 50 from the capacitor contact plug 19. The bottom electrode 21 has a lower portion that contacts with the metal barrier layer 50. The lower portion of the bottom electrode 21 is smaller in horizontal size than the metal barrier layer 50 and the upper portion of the contact plug 19. The metal-metal interface between the bottom electrode 21 and the metal barrier layer 50 has a second area that is smaller than the first area. Namely, the metal-polysilicon interface is larger in area than the metal-metal interface. The side edge of the lower portion of the bottom electrode 21 is positioned inside the aligned side edge of the metal barrier layer 50 and the upper portion of the contact plug 19.

This structure ensures that the metal-metal interface between the bottom electrode 21 and the metal barrier layer 50 is substantially identical in the area to the metal-polysilicon interface between the metal barrier layer 50 and the upper portion of the capacitor contact plug 19, even if the capacitor 60 is misaligned to the capacitor contact plug 19 as long as the side edge of the lower portion of the bottom electrode 21 is positioned inside the aligned side edge of the metal barrier layer 50 and the upper portion of the contact plug 19. Namely, the side edge of the lower portion of the bottom electrode 21 can be positioned inside the aligned side edge of the metal barrier layer 50 and the upper portion of the contact plug 19 even if the capacitor 60 is misaligned to the capacitor contact plug 19. This structure can provide a lowly resistive contact between the bottom electrode 21 and the capacitor contact plug 19.

As shown in FIG. 3, the above-described structure may also ensure the necessary contact area between the capacitor contact plug 19 and the bottom electrode 21 even if the capacitor 60 is largely misaligned to the capacitor contact plug 19 so that the side edge of the lower portion of the bottom electrode 21 can be positioned outside the aligned side edge of the metal barrier layer 50 and the upper portion of the contact plug 19.

Second Embodiment

A semiconductor device such as a DRAM of this second embodiment will be described with reference to the drawings. The second embodiment is different from the first embodiment in the shape of the capacitor contact plug and the fabrication process for the contact plug. The following descriptions will focus on the differences of the second embodiment from the first embodiment. FIGS. 4A through 4D are fragmentary cross sectional elevation views illustrating capacitor contact plugs, in sequential steps involved in a method of forming the DRAM memory cell of the second embodiment.

Processes resulting in forming the bit line layer 17 are carried out in the same ways as described in the first embodiment. Duplicate descriptions of the same processes will be omitted.

A plasma enhanced chemical vapor deposition process is carried out to form an inter-layer insulator 18 of silicon oxide over the bit line layer 17 and the inter-layer insulator 14. The inter-layer insulator 18 has a thickness of 500 nanometers. A chemical mechanical polishing process is carried out to planarize the inter-layer insulator 18.

Figure 4A:
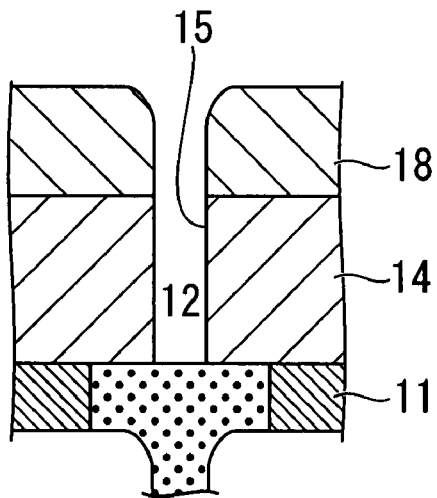
FIGS. 4A through 4D are fragmentary cross sectional elevation views illustrating capacitor contact plugs, in sequential steps involved in a method of forming the DRAM memory cell of the second embodiment.

A photo-resist is applied on the inter-layer insulator 18. A photo-lithography process is carried out using a mask to form a photo-resist pattern. An anisotropic etching process is carried out using the photo-resist pattern as a mask to selectively remove the inter-layer insulators 18 and 14, thereby forming capacitor contact holes 15 in the inter-layer insulators 18 and 14. The capacitor contact holes 15 reach the top surfaces of the cell contact plugs 12 as shown in FIG. 4A. A part of the top surface of each of the cell contact plugs 12 is exposed.

Figure 4B:
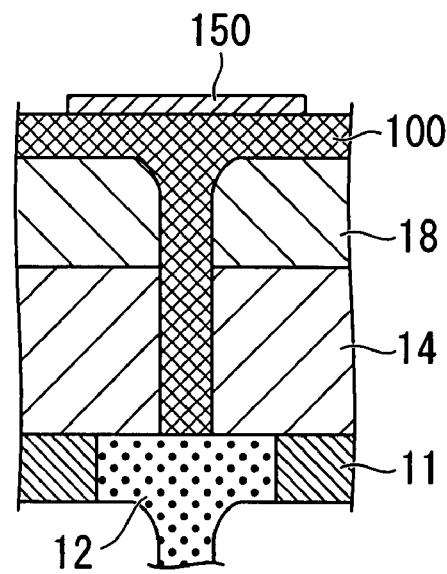

The photo-resist is removed. As shown in FIG. 4B, a chemical vapor deposition process is carried out, thereby forming an impurity doped polycrystalline silicon film 100 over the inter-layer insulator 18 and in the capacitor contact holes 15. The impurity doped polycrystalline silicon film 100 over the inter-layer insulator 18 has a thickness of 50 nanometers to 150 nanometers. A chemical mechanical polishing process is carried out to planarize the impurity doped polycrystalline silicon film 100.

Figure 4C:
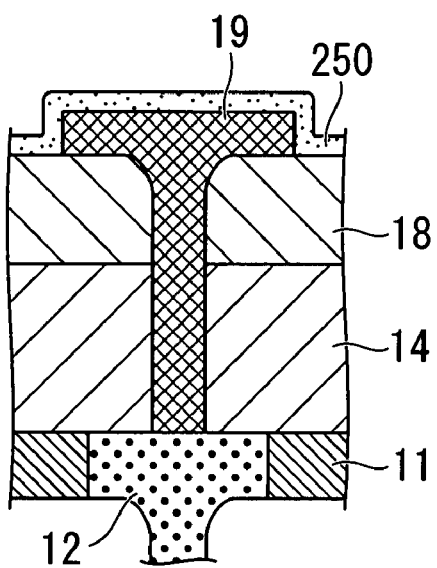

As shown in FIG. 4C, a photo-resist is applied on the impurity doped polycrystalline silicon film 100. A photo-lithography process is carried out using a mask to form a photo-resist pattern 150. An anisotropic etching process is carried out using the photo-resist pattern 150 as a mask to selectively remove the impurity doped polycrystalline silicon film 100. The anisotropic etching process is carried out using an inductively coupled plasma (ICP) source etcher, while using the photo-resist pattern 150 as a mask, thereby selectively etching the impurity doped polycrystalline silicon film 100, thereby forming capacitor contact plugs 19. The capacitor contact plugs 19 contact with the cell contact plugs 12 which contact with the source diffusion layers 9.

The etching process for etching the impurity doped polycrystalline silicon film 100 is carried out by feeding $Cl_2$ at a flow rate of 80 sccm, and HBr at a flow rate of 160 sccm, under a pressure of 1.1 Pa (8 mTorr), by keeping the temperature of a wafer stage at 40° C. and applying a source power of 800 W at a frequency of 13.56 MHz and an RF bias power of 100 W at a frequency of 13.56 MHz. The photo-resist pattern 150 is removed. Etching products are removed from the surfaces of the capacitor contact plugs 19 by diluted HF. A sputtering process is carried out to form a metal layer 250 of cobalt over the capacitor contact plugs 19 and over the inter-layer insulator 18. The metal layer 250 of cobalt has a thickness of 50 nanometers.

Figure 4D:
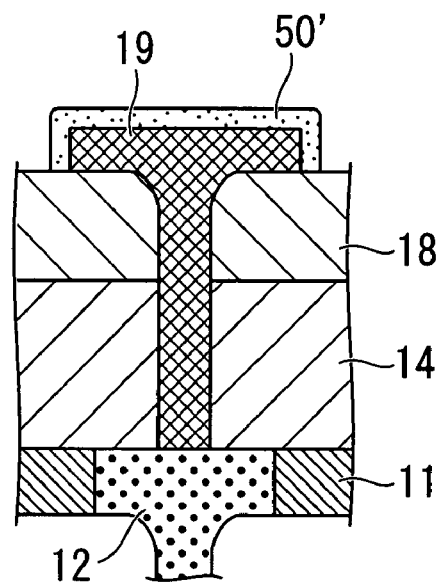
Figure 5:
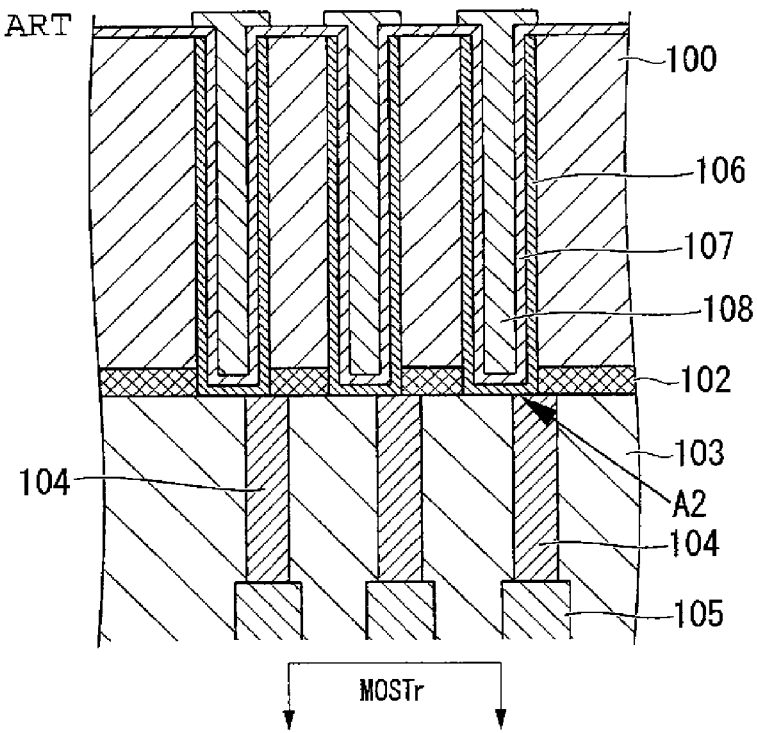
FIG. 5 is a fragmentary cross sectional elevation view illustrating the conventional DRAM having capacitors.
Figure 6:
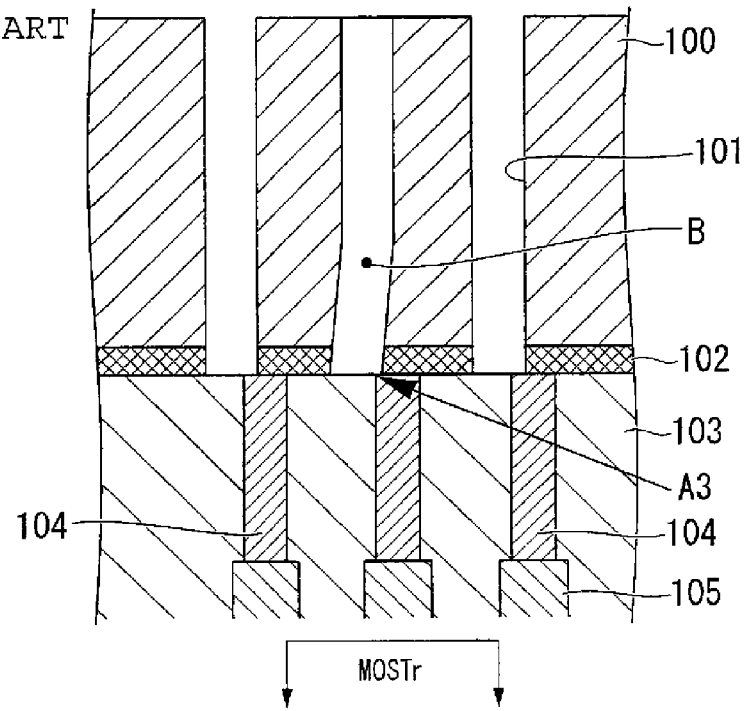
FIG. 6 is a fragmentary cross sectional elevation view illustrating the capacitor holes of the conventional DRAM having capacitors.
Figure 7:
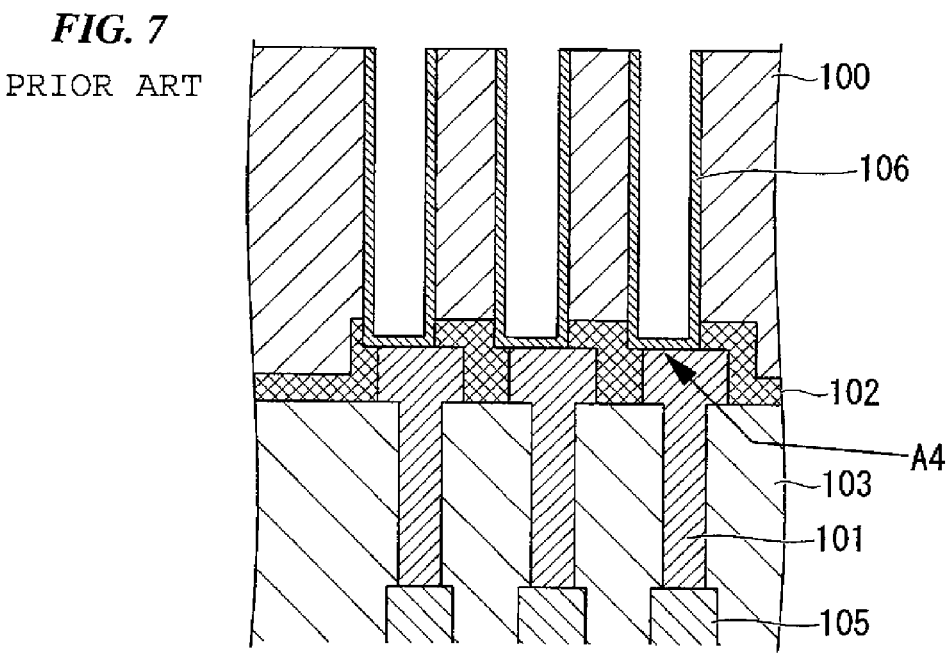
FIG. 7 is a fragmentary cross sectional elevation view illustrating the capacitor holes of the other conventional DRAM having capacitors.
Figure 8:
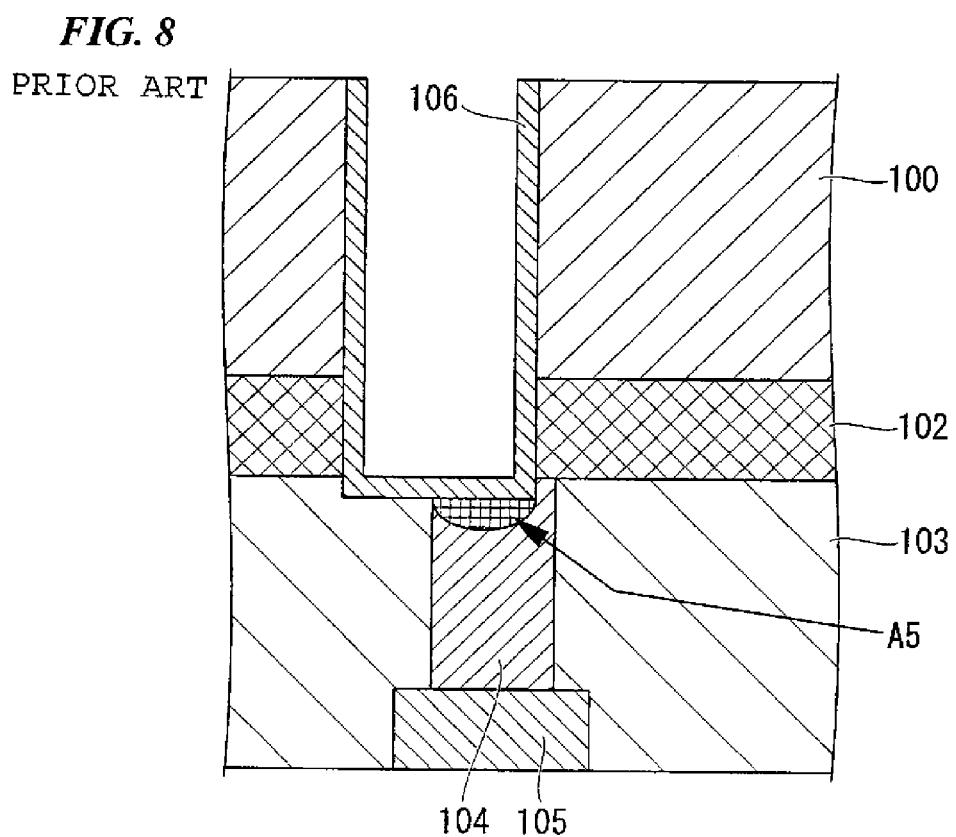
FIG. 8 is a fragmentary cross sectional elevation view illustrating the capacitor holes of the other conventional DRAM having capacitors.

As shown in FIG. 4D, an annealing process is carried out to cause a silicidation reaction on the interface between the metal layer 250 of cobalt and the capacitor contact plugs 19 of impurity doped polycrystalline silicon, while no silicidation reaction is caused on the interface between the metal layer 250 of cobalt and the inter-layer insulator 18. The annealing process is carried out at a temperature in the range of 400° C. to 800° C. As a result of the silicidation reaction, a metal barrier layer 50' of cobalt silicide is formed on the surface of the capacitor contact plug 19, while leaving the metal layer 250 of cobalt on the surface of the inter-layer insulator 18. An etching process is carried out using sulfuric acid to remove the unreacted metal layer 250 of cobalt from the surface of the inter-layer insulator 18, while leaving the metal barrier layer 50' of cobalt silicide on the surface of the capacitor contact plug 19 of impurity doped polycrystalline silicon.

The semiconductor memory device of this second embodiment is different from the semiconductor memory device in that the metal barrier layer 50' of cobalt silicide covers the upper surface and the side edge of the upper portion of the capacitor contact plug 19, and any hard mask such as the hard mask 200 is not present. FIG. 1 illustrates the structure of the semiconductor memory device of this second embodiment, except for the above-described structural difference, even the following descriptions will be made with reference again to FIG. 1.

A low pressure chemical vapor deposition process is carried out to form a silicon nitride film 500 which covers the metal barrier layer 50' and the inter-layer insulator 18.

A plasma enhanced chemical vapor deposition process is carried out to form an inter-layer insulator 20 of silicon oxide on the silicon nitride film 500. The inter-layer insulator 20 has a thickness of 3000 nanometers.

A photo-resist is applied on the inter-layer insulator 20. A photo-lithography process is carried out using a mask to form a photo-resist pattern. An anisotropic etching process is carried out using the photo-resist pattern as a mask to selectively remove the inter-layer insulator 20, thereby forming capacitor holes 30 in the inter-layer insulator 20. The capacitor holes 30 reach the silicon nitride film 500. Parts of the top surface of the silicon nitride film 500 are exposed. A further anisotropic etching process is carried out using the photo-resist pattern as a mask to selectively remove the silicon nitride film 500 so that the capacitor holes 30 reach the metal barrier layers 50'. Parts of the top surfaces of the metal barrier layers 50' are exposed.

The photo-resist pattern is removed. A chemical vapor deposition process is carried out to form a titanium nitride film on the bottoms and side walls of the capacitor holes 30 and over the inter-layer insulator 20. The titanium nitride film on the bottoms of the capacitor holes 30 contact with the metal barrier layers 50'. A further chemical vapor deposition process is carried out to form a titanium film on the titanium nitride film, thereby forming a stack of the titanium nitride film and the titanium film on the bottoms and side walls of the capacitor holes 30 and over the inter-layer insulator 20. The stack of the titanium nitride film and the titanium film has a thickness of 30 nanometers. The capacitor holes 30 are not filled up by the stack of the titanium nitride film and the titanium film.

A photo-resist is applied on the inter-layer insulator 20. A photo-lithography process is carried out using a mask to form a photo-resist pattern. An anisotropic etching process is carried out using the photo-resist pattern as a mask to remove the stack of the titanium nitride film and the titanium film from the top surface of the inter-layer insulator 20, while leaving the stack of the titanium nitride film and the titanium film in the capacitor holes 30, thereby forming bottom electrodes 21 in the capacitor holes 30. Each of the bottom electrodes 21 is formed of the stack of the titanium nitride film and the titanium film. The photo-resist pattern is removed.

An atomic layer deposition process is carried out to form a capacitive insulating film 22 of aluminum oxide on the bottom electrodes 21 and the top surface of the inter-layer insulator 20. The capacitive insulating film 22 has a thickness of 6 nanometers.

A chemical vapor deposition process is carried out to form a metal layer of titanium nitride on the capacitive insulating film 22. The metal layer fills up the capacitor holes 30 and extends over the inter-layer insulator 20. The metal layer has a thickness of 30 nanometers. Optionally, it is possible that any further metal layer may be formed on the metal layer.

A photo-resist is applied on the metal layer. A photolithography process is carried out using a mask to form a photo-resist pattern. An anisotropic etching process is carried out using the photo-resist pattern as a mask to selectively remove the metal layer, thereby forming a top electrode 23 on the capacitive insulating film 22. The resist pattern is removed. As a result, the capacitors 60 are formed in the capacitor holes 30. The capacitors 60 may be cylindrically shaped. Each of the capacitors 60 has a metal-insulator metal structure which includes the bottom electrode 21, the capacitive insulating film 22 and the top electrode 23.

The above-described processes form the memory cell area of the semiconductor memory device. The peripheral circuit area can also be formed in similar processes to the above-described processes for forming the memory cell area.

In accordance with this second embodiment of the present invention, the metal barrier layer 50' of cobalt silicide is interposed between the capacitor contact plug 19 and the bottom electrode 21 of the capacitor 60. Namely, the metal barrier layer 50' of cobalt silicide is formed on the top surface and side edge of the upper portion of the capacitor contact plug 19, thereby forming a metal silicide-polysilicon interface between the metal barrier layer 50' of cobalt silicide and the capacitor contact plug 19. Then, the bottom electrode 21 of the capacitor 30 is formed on the metal barrier layer 50' of cobalt silicide, thereby forming a metal-metal silicide interface between the bottom electrode 21 and the metal barrier layer 50' of cobalt silicide. This structure including the capacitor contact plug 19 of polycrystalline silicon, the metal barrier layer 50' of cobalt silicide and the bottom electrode 21 of metal prevents that the contact resistance between the bottom electrode 21 and the capacitor contact plug 19 is increased due to the abnormal silicidation.

Each of the capacitor contact plugs 19 has an upper portion that has a larger horizontal size than the other portion. The metal barrier layer 50' of cobalt silicide is provided on the entirety of the upper surface and side edge of the upper portion of the capacitor contact plug 19. The metal silicide-polysilicon interface between the metal barrier layer 50' of cobalt silicide and the capacitor contact plug 19 has a first area. The bottom electrode 21 of the capacitor 60 contacts with a part of the upper surface of the metal barrier layer 50' of cobalt silicide. The bottom electrode 21 is separated by the metal barrier layer 50' of cobalt silicide from the capacitor contact plug 19. The bottom electrode 21 has a lower portion that contacts with the metal barrier layer 50' of cobalt silicide. The lower portion of the bottom electrode 21 is smaller in horizontal size than the metal barrier layer 50' of cobalt silicide and the upper portion of the contact plug 19. The metal-metal silicide interface between the bottom electrode 21 and the metal barrier layer 50' of cobalt silicide has a second area that is smaller than the first area. Namely, the metal silicide-polysilicon interface is larger in area than the metal-metal silicide interface. The side edge of the lower portion of the bottom electrode 21 is positioned inside the side edge of the metal barrier layer 50' of cobalt silicide and the side edge of the upper portion of the contact plug 19.

This structure ensures that the metal-metal silicide interface between the bottom electrode 21 and the metal barrier layer 50' of cobalt silicide is substantially identical in the area to the metal silicide-polysilicon interface between the metal barrier layer 50' of cobalt silicide and the upper portion of the capacitor contact plug 19, even if the capacitor 60 is misaligned to the capacitor contact plug 19 as long as the side edge of the lower portion of the bottom electrode 21 is positioned inside the side edge of the metal barrier layer 50' of cobalt silicide and the side edge of the upper portion of the contact plug 19. Namely, the side edge of the lower portion of the bottom electrode 21 can be positioned inside the side edge of the metal barrier layer 50' of cobalt silicide and the side edge of the upper portion of the contact plug 19 even if the capacitor 60 is misaligned to the capacitor contact plug 19. This structure can provide a lowly resistive contact between the bottom electrode 21 and the capacitor contact plug 19.

The above described structure and processes are allocable not only to the DRAMs but also to any other semiconductor devices such as a device integrating DRAM with multilayer interconnections or a MOS transistor circuit free of DRAM.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising: a semiconductor substrate;
   a MOS transistor having source and drain regions that are provided in the semiconductor substrate;
   a first inter-layer insulator over the MOS transistor, the first inter-layer insulator having first contact holes that reach the source and drain regions;
   cell contact plugs in the first contact holes, the cell contact plugs contact with the source and drain regions;
   a second inter-layer insulator over the first inter-layer insulator and the cell contact plugs, the second inter-layer insulator having second contact holes that reach the cell contact plugs;
   contact plugs each having first and second portions, the first portion being in the second contact hole, the second portion extending over the second inter-layer insulator;
   metal barrier layers that cover the upper surfaces of the second portions of the contact plugs; and
   capacitors each having a bottom electrode layer, a capacitive insulating layer and a top electrode layer, the bottom electrode layers each having a contact portion that contacts with the metal barrier layer.

2. The semiconductor device according to claim 1, wherein the contact plugs are made of polysilicon.

3. The semiconductor device according to claim 1, wherein the second portion of the contact plug is larger in the area in plan view than the contact portion of the bottom electrode layer.

4. The semiconductor device according to claim 1, wherein the metal barrier layer has a single layered structure that includes one of a tungsten nitride layer and a titanium nitride layer.

5. The semiconductor device according to claim 1, wherein the metal barrier layer comprises one of:
   a first multilayered structure of a titanium nitride layer and a titanium silicide layer;
   a second multilayered structure of a tungsten layer and a tungsten nitride layer;
   a third multilayered structure of a tungsten nitride layer and a tungsten silicide layer;
   a fourth multilayered structure of a tungsten layer, a tungsten nitride layer and a tungsten silicide layer; and
   a fifth multilayered structure of a tungsten layer, a titanium nitride layer and a titanium silicide layer.

6. The semiconductor device according to claim 1, wherein the metal barrier layer has a single layered structure that includes one of a titanium silicide layer, a cobalt silicide layer, and a tungsten silicide layer.

7. A semiconductor device comprising:
   a first insulator having a first contact hole;
   a first contact plug of polysilicon, the first contact plug having first and second portions, the first portion being in the first contact hole, the second portion extending over the first insulator, the first portion having a first dimension defined in a direction parallel to a surface of the first insulator, the second portion having a second dimension defined in the direction parallel to the surface of the first insulator, the second dimension being greater than the first dimension;
   a metal barrier layer that contacts with at least an upper surface of the second portion of the first contact plug, the metal barrier layer having a metal-polysilicon interface with the first contact plug of polysilicon, the metal-polysilicon interface having a first area; and
   a first metal electrode layer having a contact portion that contacts with a part of the metal barrier layer, the first metal electrode layer being separated by the metal barrier layer from the first contact plug of polysilicon, the first metal electrode layer having a metal-metal interface with the metal barrier layer, the metal-metal interface having a second area that is smaller than the first area, the contact portion of the first metal electrode having a third dimension defined in the direction parallel to the surface of the first insulator, the third dimension of the contact portion of the first metal electrode layer being smaller than the first dimension.

8. The semiconductor device according to claim 7, wherein the metal barrier layer contacts with the upper surface and side edge of the second portion of the first contact plug.

9. The semiconductor device according to claim 7, further comprising:
   a semiconductor substrate;
   a diffusion region in the semiconductor substrate; and
   a second contact plug of polysilicon, the second contact plug having third and fourth portions, the third portion contacting with the diffusion region, the fourth portion contacting with the first portion of the first contact plug, the third portion having a third dimension defined in the direction parallel to the surface of the first insulator, the fourth portion having a fourth dimension defined in the direction parallel to the surface of the first insulator, the fourth dimension being greater than the third dimension and the first dimension.

* * * * *